United States Patent [19]

Uratsuji

[11] Patent Number: 5,186,641

[45] Date of Patent: Feb. 16, 1993

[54] SOCKET FOR ELECTRIC PART

[75] Inventor: Kazumi Uratsuji, Tokyo, Japan

[73] Assignee: Yamaichi Electric Co., Ltd., Tokyo, Japan

[21] Appl. No.: 777,114

[22] Filed: Oct. 16, 1991

[30] Foreign Application Priority Data

Oct. 17, 1990 [JP] Japan .................................. 2-278461

[51] Int. Cl.$^5$ ............................................. H01R 11/22
[52] U.S. Cl. .................................... 439/266; 439/331; 439/70
[58] Field of Search ....................... 439/70, 71, 72, 73, 439/330, 331, 259-264, 266-270

[56] References Cited

U.S. PATENT DOCUMENTS

| 2,965,811 | 12/1960 | Batchet | 439/259 X |
| 4,623,208 | 11/1986 | Kerul et al. | |
| 4,950,980 | 8/1990 | Pfaff | 439/342 X |
| 4,993,955 | 2/1991 | Savant | 439/331 X |

OTHER PUBLICATIONS

IBM Technical Disclosure Bulletin, vol. 16, No. 12, May 1974.

Primary Examiner—Larry I. Schwartz
Assistant Examiner—Khiem Nguyen
Attorney, Agent, or Firm—Wenderoth, Lind & Ponack

[57] ABSTRACT

A socket for an electric part has an electric part accommodating space, and a plurality of contacts arranged in parallel relation along at least two opposing sides of the space. Each of the contacts has a contact nose portion to be contacted with a contact of the electric part accommodated in the electric part accommodating space, and a spring portion for biasing the contact nose portion inwardly in order to obtain a contacting pressure with the contact of the electric part. The socket also has a pivotable lever disposed along a row of contacts. One end of the pivotable lever is engaged with the contact and the other end extends outwardly from the engaging portion of the contact. The pivotable lever is supported so as to be pivoted about its fulcrum point, which varies in its location on the lever depending on the position of the lever along its pivot path. The pivotable lever, when its other end is pushed down, is pivoted about the fulcrum point to permit the engaging portion to displace the contact nose of the contact outwardly against the resiliency of the spring portion, so that the contact nose is separated from the contact of the electric part.

3 Claims, 2 Drawing Sheets

SOCKET FOR ELECTRIC PART

BACKGROUND OF THE INVENTION

1. Field of the Invention

This invention relates to a zero load insertion type socket for an electric part including a means for displacing a contact between a contacted position and a released position.

2. Brief Description of the Prior Art

In a conventional socket represented by, for example, U.S. Pat. No. 4,623,208, a contact itself includes a cantilevered arm projecting outwardly. When the cantilevered arm is pushed down with a presser cover, a curved spring portion, which is provided as part of the contact itself, is flexed in the compressing direction to realize an outward displacement to thereby separate a contact nose portion from a contact of an IC, so that the IC can be inserted and removed with no load.

In the above-mentioned conventional IC socket, the operational force for pushing down the presser cover and the contacting force of the contact are determined by the spring portion of the contact.

Accordingly, if a spring constant of the spring portion is increased in order to increase the contacting force, the operational force necessary for pushing down the presser cover must also be increased. On the contrary, if the spring constant of the spring portion is reduced in order to reduce the necessary operational force, the contacting force is also reduced. The conventional IC socket incurred these problems. Therefore, it was difficult for the conventional IC socket to be designed so as to satisfy both the requirement of reducing the operational force as much as possible and increasing the contacting force.

The arrangement in which the spring portion must be compressed in order to obtain an outward displacement motion by pushing down the cantilevered ar is inconvenient in that the amount of outward displacement realized relative to the amount by which the cantilevered arm is pushed down is very limited, and in that an efficient amount of displacement relative to the amount by which the cantilevered arm is pushed down is unobtainable.

It is also undesirable that when the cantilevered arm is pushed down, the axis of the contact tends to be twisted, an undesirable shifting of the contact nose portion occurs, and metal fatigue tends to accumulate in the basal portion of the cantilevered arm when an external force is repeatedly exerted on the cantilevered arm in the curved direction.

In the conventional contact, various complicated design specifications or conditions must be satisfied, such as providing a sectional area which will provide a certain strength, and setting of the spring constant, and a counter-measure for twisting, etc.

SUMMARY OF THE INVENTION

It is therefore an object of the present invention to provide a socket for an electric part, wherein the pushing force necessary for releasing the electric part is reduced, yet the contacting force between the contacts of the socket and the electric part is increased.

Another object of the present invention is to provide a socket for an electric part wherein the socket has a contact which can be efficiently displaced outwardly displacement such that a sufficient amount of outward displacement can be obtained with a limited downwardly directed force.

A further object of the present invention is to provide a socket for an electric part wherein such problems as twisting of a contact resulting from a pushing down operation and metal fatigue of a cantilevered arm are not present, and wherein the contact can be properly displaced even after the socket has been used repeatedly.

To achieve the above objects, there is provided a socket for an electric part including a pivotable lever disposed along a row of contacts which each have a contact nose portion and a spring portion. One end of the pivotable lever is engaged with the contact and the other end thereof tends outwardly from the engaging portion. The pivotable lever is supported so as to be pivoted about its fulcrum point which varies in location along the lever. The pivotable lever, when the other end thereof is pushed down, is pivoted about its fulcrum point to permit the engaging portion to displace a contact nose of the contact outwardly against the resiliency of the spring portion, so that the contact nose is separated from a contact of an electric part to enable insertion and removal of the electric part under zero load.

In the socket for an electric part according to the present invention, when one end of the pivotable lever supported by its fulcrum point is pivoted downwardly about the fulcrum point, the other end portion of the pivotable lever forces the contact outwardly. As a result, the contact is displaced outwardly against the resiliency of the spring portion and is separated from the contact of the electric part accommodated in the electric part accommodating space, to release the electric part. Therefore, the electric part can be removed or inserted under zero load.

When the downward force exerted on the other end portion of the pivotable lever is released, the pivotable lever is pivoted upwardly by the resiliency of the spring portion of the contact and then waits for the next pushing down operation. At the same time, the contact is displaced inwardly by being biased by the spring portion and is brought into contact with the upper surface of the contact of the electric part under pressure.

In the above-mentioned socket for an electric part, the spring portion of the contact can be provided with a spring constant which will allow it to contact the contact of the electric part with a proper contacting force. On the other hand, the pivotable lever can be pushed down with a reduced operational force in accordance with the principles of the lever. Even if the spring constant of the spring portion of the contact is set large, this will not directly result in an increase of downward force necessary to operate the lever. This pushing down force can be reduced by properly setting the distances of the operating portion and acting portion from the fulcrum of the pivotable lever. At the same time, the object of increasing the contacting force can also be achieved.

Furthermore, since the pivotable lever exerts an outward force directed upwardly at an angle to the contact so that the contact is separated from the contact of an electric part, the outward displacement of the contact can be realized efficiently relative to the pushing down force of the pivotable lever, and a sufficient space for accommodating the electric part can be provided.

Moreover, the unfavorable problems, such as twisting of the contact and an accumulation of metal fatigue in the cantilevered arm when the cantilevered arm of the contact is pushed down, which were present in the prior art, do not occur, and the contact can be properly displaced even after repeated use of the socket.

The above and other objects and attendant advantages of the present invention will be readily apparent to those skilled in the art from a reading of the following detailed description in conjunction with the accompanying drawings which show a preferred embodiment of the present invention.

BRIEF DESCRIPTION OF THE DRAWINGS

FIGS. 1 through 4 show an embodiment of the present invention, wherein:

FIG. 1 is a perspective view showing an outer appearance of a socket for an electric part;

FIGS. 2 and 3 are sectional views of an important part of the socket for an electric part, respectively showing open and closed states of a contact; and FIG. 4 is a sectional view showing an operating state of an important part of the socket for an electric part, wherein the contact is in contact with a contact of the electric part under pressure.

DETAILED DESCRIPTION OF THE PREFERRED EMBODIMENT

Figure 1:
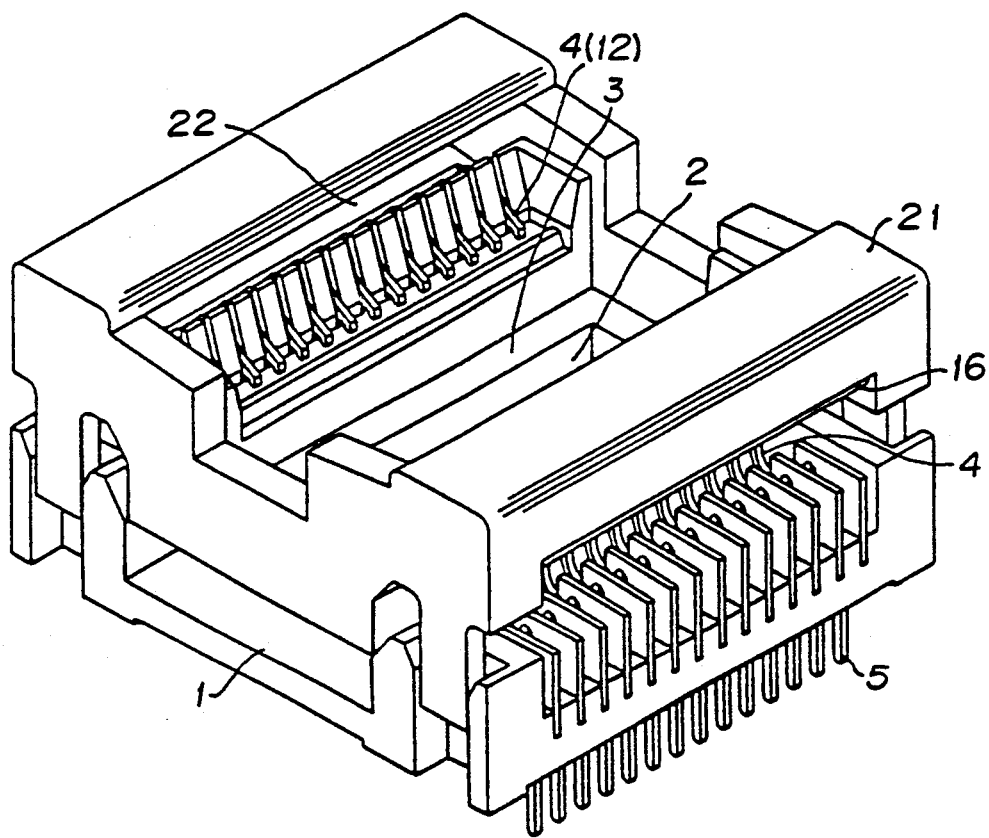
Figure 2:
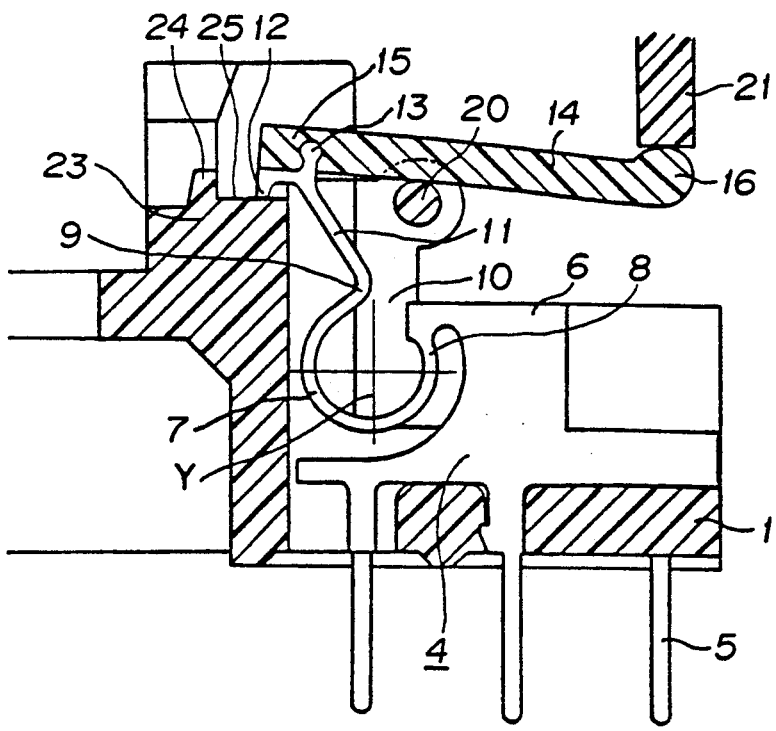

An embodiment of the present invention will be described hereinafter in detail with reference to FIGS. 1 through 4 of the accompanying drawings.

A base member 1 formed of an insulating material has a central opening 2 through its upper and lower surfaces. A space 3 for accommodating an electric part is defined at the upper side of the central opening 2. The base member 1 is provided with a plurality of contacts 4 arranged in parallel relation along at least two opposed sides of the space 3.

The contacts 4 are implanted in the base member 1. Each contact 4 includes a male terminal 5 extending downward from a lower surface of the base member 1. The contact 4 also includes a flat portion 6 connected to a basal portion of the male terminal 5. The flat portion (or base portion) 6 is supported on and vertically erected from an upper surface of an implanted wall of the contact. The contact 4 further includes a spring portion 7 connected to an inner edge of an upper end of the flat portion 6. The spring portion 7 has a curved shape which extends downward from its basal portion 8 connected with the flat portion 6 and then curves back to the vicinity of the basal portion 8. In other words, the spring portion 7 has a downwardly directed curved shape. An angle of the curve is set such that a predetermined small distance 10 is formed between the basal portion 8 and a distal end 9 of the spring portion 7 extending from the basal portion 8. This angle of the curve is preferably set to 180 degrees or more, and more preferably to 250 degrees or more. In other words, the spring portion 7 is curved such that the distal end 9 thereof reaches the vicinity of an upper end of a vertical center line Y of the curved spring portion 7. The contact 4 further includes a contact arm 11 which is connected to the distal end 9 of the curved spring portion 9 and inclines inwardly therefrom. The contact arm 11 has a contact nose 12 projecting inwardly and downwardly from its distal end.

The spring portion 7 urges the contact arm 11 and the contact nose 12 inwardly so that the contact nose 12 is brought into contact with a contact 18 of an electric part 17 represented by an IC. The contact 4 further includes an engaging element 13 extending upwardly from the distal end of the arm 11, that is, from the junction of the arm 11 and the contact nose 12. A pivotable lever 14 extends in parallel with a row of the contacts 4 at the outer side of the contacts. The pivotable lever 14 is provided at one end thereof with an acting portion 15 and at the other end thereof with an outwardly extending operating portion 16. The acting portion 15 is engaged with the engaging element 13. For example, the engaging element 31 is integrally connected with the acting portion 15 of the pivotable lever 14. The engaging element 13 can be integrally connected with the pivotable lever 14 by molding or can be press fitted into the pivotable lever 14. Accordingly, the pivotable lever 14 has a fulcrum point which, during pivoting of the lever 14, moves along a predetermined path.

Figure 3:
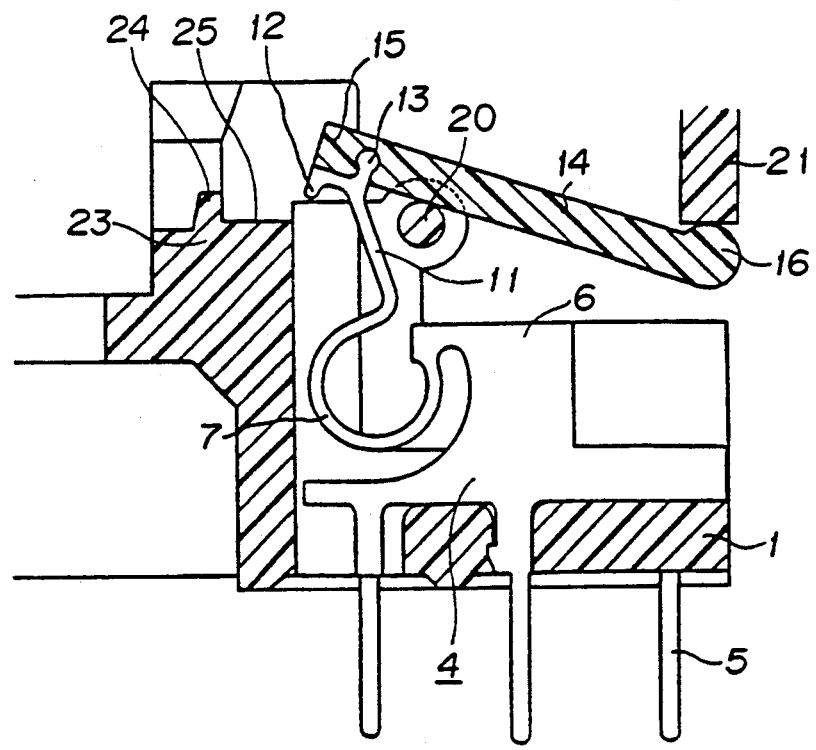

The drawings show one example of the structure of the pivotable lever and its fulcrum point. As illustrated, the pivotable lever 14 is placed on a guide shaft 20 disposed on the base member 1 side adjacent a midpoint of the pivotable lever 14, i.e. somewhere between the acting portion 15 and the operating portion 16, and is supported thereon such that the pivotable lever 14 can pivot upwardly and downwardly while sliding on the surface of the guide shaft 20. When the lever 14 is pivoted, the fulcrum point of the lever 14 moves about the guide shaft 20. That is, the fulcrum point of the lever 14 is not fixed, but rather moves relative to the base 1 and the guide shaft 20 in which it is supported. Thus, when the operating portion 16 is pushed down from the state shown in FIG. 2, the pivotable lever 14 is pivoted downwardly while sliding on the surface of the guide shaft 20 from its extreme upper position toward its extreme lower position. When this occurs, the acting portion 15, due to its engagement with the engaging element 13, forces a free end (i.e. the end having contact nose 12) of the contact 4 outwardly against the resiliency of the spring portion 7, as shown in FIG. 3. As a result, the contact nose portion 12 is moved to a non-contacting position to form non-interference state with the electric part 17. In that state, the electric part 17 can be freely inserted and removed.

Figure 4:
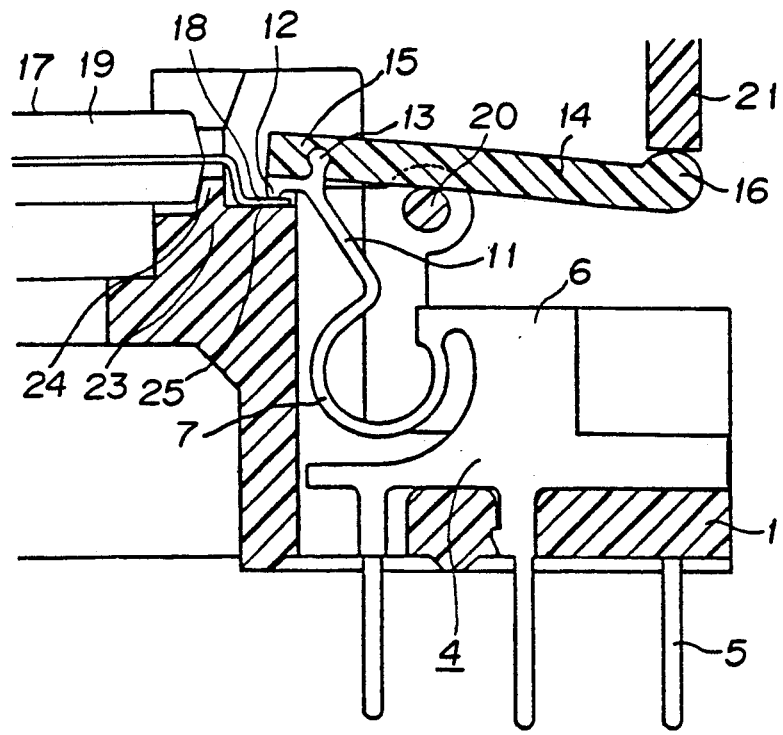

Also, the pivotable lever 14 can be pivoted upwardly while sliding on the surface of the guide shaft 20 by the resiliency of the spring portion 7. At the same time, as shown in FIG. 4, the contact 4 is displaced inwardly by the resiliency of the spring portion 7 to urge the contact nose portion 12 against the upper surface of the contact 18 of the electric part 17.

Although not illustrated, a pivotal movement about a fulcrum point can be realized by bringing the fulcrum point of the pivotable lever 14 into sliding engagement with a cam face or a cam groove. Although not illustrated, a plurality of pivotable levers 14 can be provided per row of the contacts 4. In other words, one group of contacts arranged in a row can be divided into small groups of contacts, and each of the small groups of contacts can be displaced by a separate pivotable lever. The operating portion 16 of the pivotable lever 14 can be directly pushed down by a robot or by manual operation. As shown in FIG. 1, the cover 21 is disposed over the base member 1, and a central window 22 formed in the cover 21 is aligned with the electric part accommodating space 3 of the base member 1, so that the electric part 17 can be inserted into and removed from the space 3 through the central window 22. The lower surface of the presser cover 21 is placed on the operating portion 16 of the pivotable lever 14, and the operating portion 16 can be pushed down by depressing the presser cover 21 via robot or by manual operation.

A wall 23 defining the electric part accommodating space 3 is provided with a positioning ridge 24 projecting upwardly therefrom, so that the side of the electric part's body 19 is supported by the positioning ridge 24. Further, the lower surface of the contact 18 is supported by a contact supporting surface 25 formed on the upper surface of the wall 23 at the outer side of the positioning ridge 24, and the contact nose 12 is brought into contact with the upper surface of such supported contact 18 under a downward pressure.

As shown in FIG. 3, when no electric part 17 is present in the accommodating space 3, the contact nose 12 is in contact with the contact supporting surface 25 so that the contact 4 is not displaced inwardly by a predetermined amount or more. In other words, the contact supporting surface 25 forms a stop for limiting the inward displacement of the contact 4. As a result, the operating portion 16 of the pivotable lever 14 is normally pivoted upwardly to a fixed position by the elasticity of the contact 4 and held in a waiting state.

As described above, when the operating portion 16 of the pivotable lever 14 is pushed down, the pivotable lever 14 is pivoted downwardly while moving along the surface of the guide shaft 20. In this manner, the contact 4 is caused to be displaced outwardly by the acting portion 15. More specifically, at an initial stage of the downward pivotal movement about the fulcrum point, the pivotable lever 14 is continuously pivoted about its fulcrum point to displace the contact nose portion 12 rearwardly while effectively generating a force for pulling up the contact nose portion 7 of the contact 4. In other words, the pivotable lever 14 can efficiently move the contact nose portion 12 of the contact 4 upwardly at angles away from the contact 18 of the electric part 17.

According to the present invention, the spring portion of the contact can be provided with a spring constant which will allow the nose contact 12 to contact the contact 18 of the electric part 19 with a desired contacting force. Accordingly, the contact can be freely designed without being restricted by the operating force of the pivotable lever. On the other hand, the pivotable lever can be pushed down with a reduced force in accordance with the principles of lever. Even if the spring constant of the spring portion of the contact is increased, this does not lead directly to an increase in the force necessary to push the lever 14 down. By properly setting the distances of the operating portion and the acting portion from the guide shaft supporting the pivotable lever, the necessary operating force can be reduced. As a result, the object for increasing the contacting force can be achieved while reducing the necessary operating force.

Furthermore, since the acting portion of the contact is effective to displace the contact outwardly to separate the contact nose portion from the contact of the electric part while pulling up the contact nose portion at the initial stage of pivotal movement, the contact can be efficiently displaced outwardly pushing down on the pivotable lever. As a result, the electric part can be readily released from the accommodating space. When the pivotable lever is pivoted downward about its fulcrum point while sliding on the surface of the guide shaft, it can especially efficiently pull up the contact nose portion of the contact.

Moreover, the present invention effectively prevents the twisting which occurs in the prior art where the cantilevered arm of a contact is depressed and metal fatigue accumulates in the cantilevered arm. As a result, the contact can be displaced without any problems even if it is used repeatedly.

While a preferred embodiment of the present invention has been shown and described in detail, it should be understood that this is for illustration purpose only, and should not be taken as a definition thereof. Rather, reference should be made to the appended claims for that purpose.

What is claimed is:

1. A socket for receiving an electric part having contact elements, comprising:
    a base having an accommodating space defined therein for receiving the electric part;
    a plurality of contacts arranged in parallel relation to one another in rows along at least two opposing sides of said accommodating space, each of said contacts including a nose portion for contacting one of the contact elements of the electric part when the electric part is accommodated in said accommodating space, and a spring portion for biasing said nose portion inwardly toward said accommodating space and causing said nose portion to press against the contact element of the electric part;
    a guide shaft, associated with each of said rows of said contacts, fixed relative to said base;
    a pivotable lever operably associated with each of said rows of said contacts and with each of said guide shafts and having a first end disposed outwardly of said accommodating space and inwardly of said guide shaft and a second end disposed on a side of said guide shaft opposite said first end;
    wherein each of said contacts is operably connected at a portion thereof adjacent said nose portion with said first end of said lever; and
    wherein said lever is slidably supported on said guide shaft, such that said guide shaft defines a pivot means for slidably and pivotably supporting said lever such that, when said second end of said lever is pressed downwardly, said lever slides along said guide shaft moving laterally relative thereto in a direction outwardly from said accommodating space and pivots about said guide shaft, and said first end of said lever forces said nose portion of said contact to move upwardly and outwardly away from said accommodating space in order to release the contact element of the electric part.

2. A socket as recited in claim 1, wherein
    each of said contacts further includes a base portion fixed to said base, said spring portion of each of said contacts having a first end connected to said base portion and a second end supporting said nose portion.

3. A socket as recited in claim 2, wherein
    said spring portion of each of said contacts comprises a curved spring portion; and
    each of said contacts further includes a contact arm connected between said curved spring portion and said nose portion.

* * * * *